United States Patent [19]
Tamura et al.

[11] Patent Number: 5,146,108
[45] Date of Patent: Sep. 8, 1992

[54] PARABOLIC WAVE GENERATOR

[75] Inventors: Takahiko Tamura; Jun Ueshima, both of Tokyo, Japan

[73] Assignee: Sony Corporation, Tokyo, Japan

[21] Appl. No.: 754,570

[22] Filed: Sep. 4, 1991

[30] Foreign Application Priority Data

Sep. 5, 1990 [JP] Japan ................................ 2-235012

[51] Int. Cl.$^5$ .......................... H03K 5/00; H03K 4/08
[52] U.S. Cl. .................................... 307/261; 307/228; 328/178; 328/181; 328/35
[58] Field of Search .............. 307/228, 261, 263, 268; 328/35, 36, 178, 181, 185; 315/408, 370; 358/163, 183

[56] References Cited

U.S. PATENT DOCUMENTS 3,757,041 9/1973 Thorpe et al. ........................ 328/35
4,739,228 4/1988 Viscardi et al. ..................... 328/185

Primary Examiner—Timothy P. Callahan
Attorney, Agent, or Firm—Lewis H. Eslinger; Jay H. Maioli

[57] ABSTRACT

A parabolic wave generator in a color television receiver or the like wherein, when the amplitude level of an input sawtooth wave is higher than the center level thereof, squared currents of mutually reverse polarities obtained by squaring the difference current proportional to the difference voltage between the two levels are added to each other at a predetermined rate, so that one side portion of a nonsymmetrical parabolic wave is produced. Meanwhile, when the amplitude level of the input sawtooth wave is lower than the center level thereof, squared currents of mutually reverse polarities obtained by squaring the difference current proportional to the difference voltage between the two levels are added to each other at another predetermined rate to thereby produce the other portion of the parabolic wave. Consequently it becomes possible to generate the two side portions of mutually different waveforms. And a desired nonsymmetrical parabolic wave can be achieved by combining such two side portions with each other through addition of the currents thereof without raising any problem in regard of the discontinuity or level difference that may otherwise be caused in the vicinity of the peak of the parabolic wave.

2 Claims, 6 Drawing Sheets

PARABOLIC WAVE GENERATOR

BACKGROUND OF THE INVENTION

1. Field of the Invention

The present invention relates to a novel parabolic wave generator and, more particularly, to a circuit for generating a parabolic current of a satisfactory waveform where a complete continuity is ensured at the peak thereof without any level difference.

2. Description of the Prior Art

It is known that a color television receiver, a monitor or the like is equipped with a dynamic convergence circuit for automatically correcting any misconvergence so as to properly converge the beams emitted from three electron guns, and there is included a circuit for forming a parabolic current which is nonsymmetrical in waveform.

FIG. 6 is a schematic circuit block diagram of a conventional parabolic wave generator a, wherein a sawtooth wave transmitted from an unshown external circuit is processed in a squaring circuit b and then is supplied to one of amplifiers d and d' which are provided individually on two lines and are operated selectively via a switching circuit c. Thereafter the out of the amplifier is forwarded via another switching circuit e (interlocked with the first-mentioned switching circuit c) so that a parabolic wave is obtained from an output terminal f.

Since the amplifiers d and d' are so arranged that the gains thereof are controllable independently of each other, the parabolic wave can be shaped nonsymmetrical with respect to its peak by selectively setting the respective gains k, k' of the amplifiers d, d' at different values.

Regarding an equation $y = a \cdot t^2$ (where t denotes the time, and y denotes the amplitude having a relation of $y = x^2(t)$ in which the original signal is expressed as $x(t)$) in the coordinate system with the origin O representing the peak of the parabolic wave, changing the gains k, k' corresponds to setting the coefficient a in the above equation to mutually different values in the range of $t \geq 0$ and $t < 0$. (See the curve g represented by a broken line in the graph of FIG. 7.)

However, in the above circuit a of FIG. 6 where the squaring circuit b has an offset component, the parabolic wave fails to be shaped smoothly continuous in the vicinity of its peak at the switching time of the two signal lines by the switching circuits c and e, hence raising a problem that a level difference $\Delta h$ is induced as represented by a solid-line curve h in the graph of FIG. 7.

The offset in the squaring circuit b is derived from the relative variation existing in the base-emitter voltages $V_{BE}$ of transistors constituting a differential pair.

OBJECT AND SUMMARY OF THE INVENTION

It is an object of the present invention to provide an improved parabolic wave generator which is capable of generating a parabolic current of a satisfactory nonsymmetrical waveform while ensuring a complete continuity without any level difference in the vicinity of the peak.

According to one aspect of the present invention, there is provided a parabolic wave generator comprising: a first squared current calculating circuit for calculating two squared currents of mutually reverse polarities each corresponding to the difference voltage between the amplitude level of a sawtooth input signal and the center level thereof when the former level is higher than the latter level; a second squared current calculating circuit for calculating two squared currents of mutually reverse polarities each corresponding to the difference voltage between the amplitude level of the sawtooth input signal and the center level thereof when the former level is lower than the latter level; a first weighting-adding circuit for determining the waveform of the partial parabolic current by adding, at an adequate rate, the two squared currents of mutually reverse polarities obtained from the first squared current calculating circuit; a second weighting-adding circuit for determining the waveform of the other partial parabolic current by adding, at an adequate rate, the two squared currents of mutually reverse polarities obtained from the second squared current calculating circuit; and a current adding circuit for forming a combined parabolic wave by adding the output currents of the first and second weighting-adding circuits.

Thus, when the amplitude level of an input sawtooth wave is higher than the center level thereof, squared currents of mutually reverse polarities obtained by squaring the difference current proportional to the difference voltage between the two levels are added to each other at a predetermined rate, so that one side portion of a nonsymmetrical parabolic wave is produced. Meanwhile, when the amplitude level of the input sawtooth wave is lower than the center level thereof, squared currents of mutually reverse polarities obtained by squaring the difference current proportional to the difference voltage between the two levels are added to each other at another predetermined rate to thereby produce the other side portion of the parabolic wave. Consequently, it becomes possible to generate the two side portions of mutually different waveforms. And a desired nonsymmetrical parabolic wave can be achieved by combining such two side portions with each other through addition of the currents thereof without causing any problem in regard of the discontinuity or level difference that may otherwise be induced by the switching action.

The above and other features and advantages of the present invention will become apparent from the following description which will be given with reference to the illustrative accompanying drawings.

DESCRIPTION OF THE PREFERRED EMBODIMENT

Hereinafter the parabolic wave generator of the present invention will be described in detail with reference to a preferred embodiment shown in the accompanying drawings.

Prior to a description of the constitution of a parabolic wave generator 1, an explanation will first be given with regard to a method of producing a parabolic wave.

Figure 2:
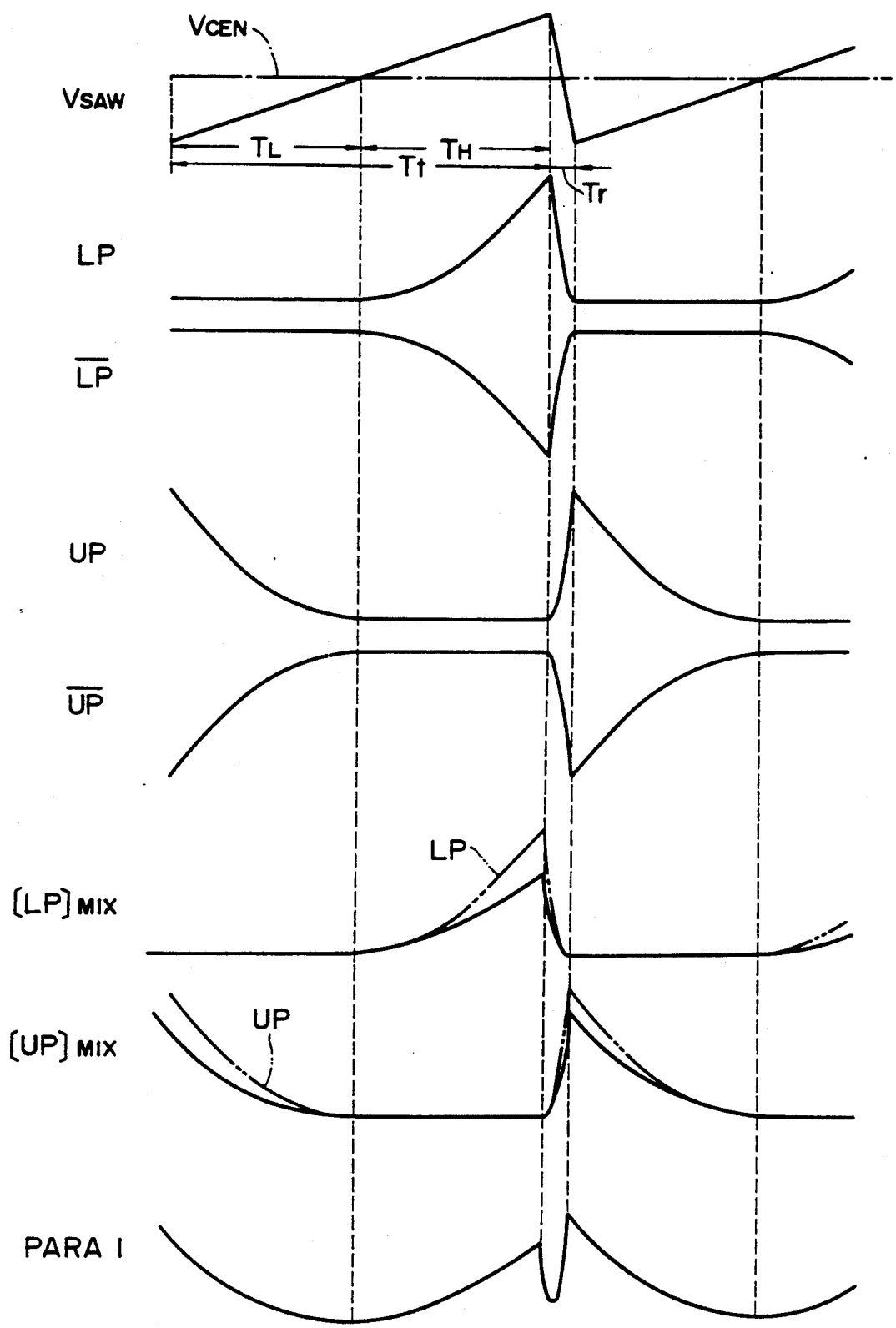
FIG. 2 schematically illustrates waveforms obtained in the process of generating a desired parabolic wave in the embodiment of FIG. 1.

In the embodiment shown in FIG. 2, the diagram is divided into upper and lower regions for obtaining two kinds of parabolic waves (i.e., an upward convex wave and a downward convex wave) so as to achieve adjustment of the convergence in the individual regions. Since such two kinds of waves can be formed by the same procedure, a description will be given below on how to produce a downward convex parabolic wave (hereinafter referred to as PARA1; and the other as PARA2).

Of the waveform shown schematically in FIG. 2, $V_{SAW}$ denotes a sawtooth voltage waveform plotted with a center voltage $V_{CEN}$ represented by a one-dot chained line.

The sawtooth wave $V_{SAW}$ is produced from a vertical synchronizing pulse and is so shaped as shown, where the amplitude level increases with a gentle inclination during a trace period $T_t$ and then decreases with a steep inclination during a retrace period $T_r$.

Denoted by LP is the waveform of a squared current obtained when the voltage level of the sawtooth wave $V_{SAW}$ exceeds the center voltage $V_{CEN}$ (i.e,. the current obtained by converting the voltage difference $V_{SAW} - V_{CEN}$ ($\geq 0$) into a current and squaring the same). The current waveform thereof is such that, as shown, first a constant current flows during a partial period $T_L$ (in which $V_{SAW} - V_{CEN} < 0$) within the trace period $T_t$, then a parabolic current of a level increasing with the lapse of time flows during a partial period $T_H$ (in which $V_{SAW} - V_{CEN} \geq 0$), and finally the level falls during the retrace period $T_r$.

Denoted by $\overline{LP}$ is a current waveform exactly inverse in polarity to the above-described LP. This waveform is reflection of the LP achieved by a mirror image process executed with respect to the level axis including the constant current value during the period $T_L$.

Denoted by UP is a waveform of a squared current obtained when $V_{SAW} - V_{CEN} < 0$. In this waveform, the level rises steeply during the retrace period $T_r$, then falls parabolically during the partial period $T_L$, and finally remains unchanged at a constant current during the next partial period $T_H$.

Denoted by $\overline{UP}$ is a waveform of a current obtained by inverting the polarity of the waveform UP.

Denoted by $[LP]_{MIX}$ is a waveform of a current obtained by multiplying the level of the positive current LP and that of the negative current $\overline{LP}$ by adequate factors respectively and then adding the two levels to each other.

Figure 3:
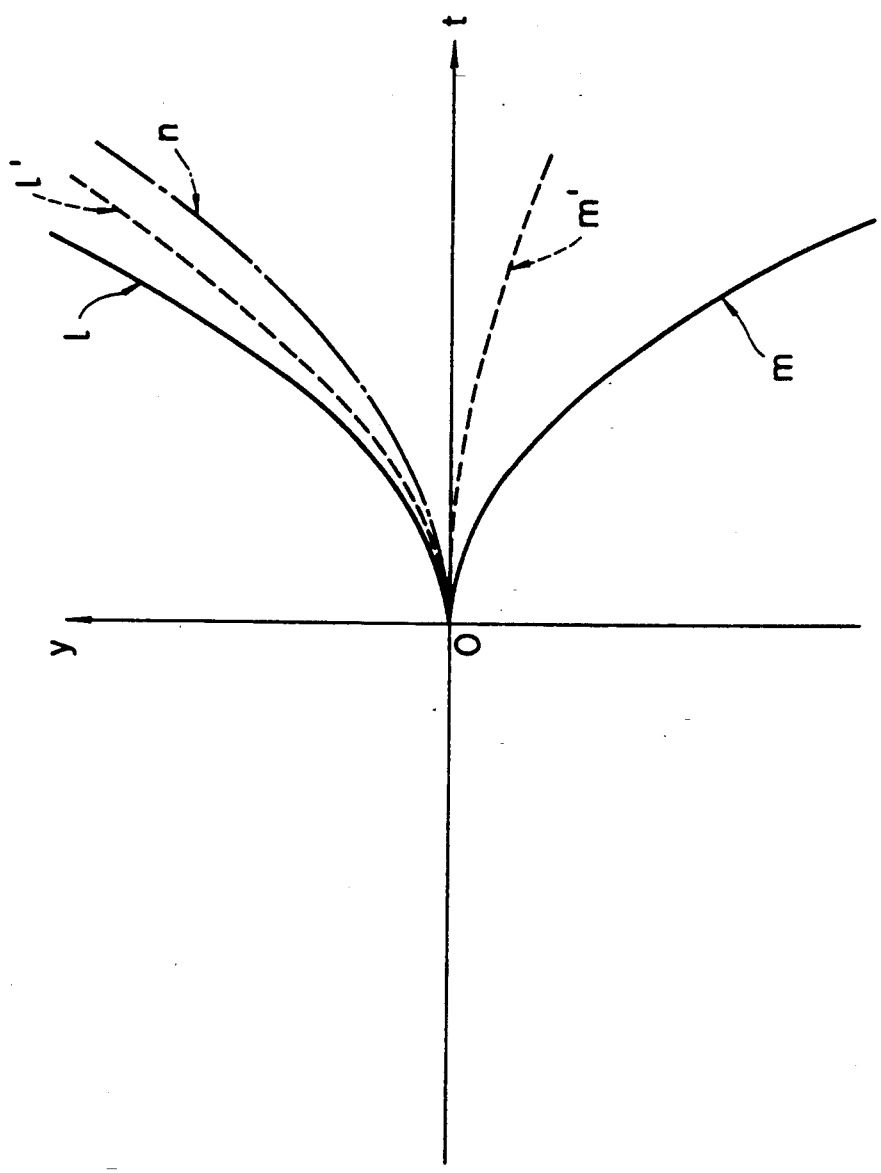
FIG. 3 graphically shows the waveform of a parabolic current produced in the embodiment of FIG. 1.
Figure 7:
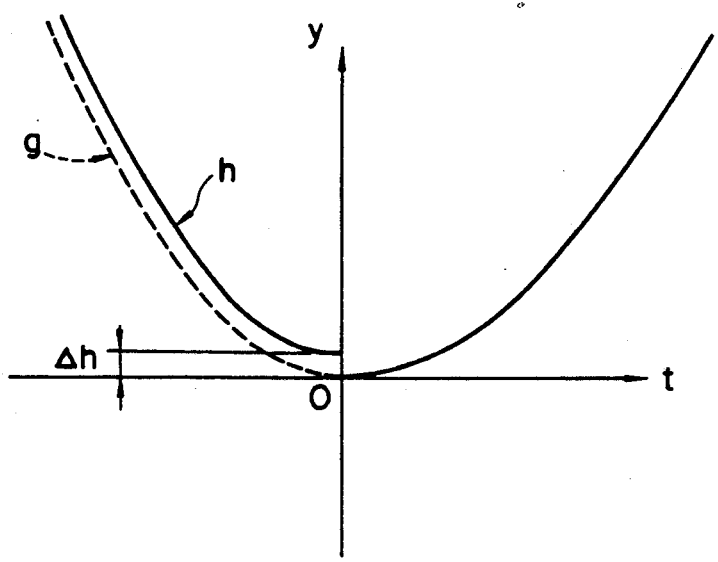
FIG. 7 is a conceptional graphic representation of a parabolic wave for explaining the problem in the prior art.

FIG. 3 is a graph conceptionally showing how to produce the waveform $[LP]_{MIX}$ where, in the t−y coordinate system selected as in the aforementioned example of FIG. 7, a curve l of the parabolic current in the first quadrant represents a portion of the waveform LP during the period $T_H$, and a curve m of the parabolic current in the fourth quadrant represents a portion of the waveform $\overline{LP}$ during the period $T_H$. Since the curve l is expressed as $y = a \cdot t^2$ and the curve m as $y = -a \cdot t^2$ respectively, the current value in such coordinate system is rendered zero if the above two are added to each other at a rate of 1:1. However, by selection of an adequate rate, the coefficient b in the equation $y = b \cdot t^2$ of the quadratic curve defined as a result of the addition can be selectively set to a desired value. For example, in case the mixing rate relative to the levels of LP and $\overline{LP}$ is set to k:1−k (where $k \neq \frac{1}{2}$, $0 < k < 1$), the curve l is changed to a curve l' ($y = k \cdot a \cdot t^2$) represented by a broken line, and also the curve m is changed to a curve m' ($y = -(1-k) \cdot a \cdot t^2$) represented by a broken line. Consequently, a curve n (represented by a one-dot chained line) corresponding to the result of adding the two currents is expressed as $Y = b \cdot t^2$ (in which $b = (2k - 1) \cdot a$), whereby the parabolic waveform is eventually changeable by selective setting of the gain k.

Denoted by $[UP]_{MIX}$ is a waveform of a current obtained by adding the currents UP and $\overline{UP}$ in the same manner as the foregoing. And the coefficient b' in an wquation $y = b' \cdot t^2$ expressive of the parabolic portion can be set independently of the aforementioned coefficient b.

Denoted by PARA1 is a parabolic voltage obtained finally by current-to-voltage conversion of the result of adding the two currents $[LP]_{MIX}$ and $[UP]_{MIX}$ to each other. Relative to the parabolic waveform, the coefficient b' in the period $T_L$ and the coefficient b in the period $T_H$ are mutually different so that the waveform is rendered nonsymmetrical.

The procedure for producing the parabolic wave mentioned above is summarized as follows.

(1) The voltage level of the input sawtooth wave $V_{SAW}$ is compared with the center voltage $V_{CEN}$ thereof, and the trace period $T_t$ is divided into two partial periods $T_H$ and $T_L$.

(2) There are produced two squared currents of mutually reverse polarities in the partial periods.

(3) A pair of the squared currents (LP and $\overline{LP}$; UP and $\overline{UP}$) in such partial periods are mixed with each other at an adequate rate to determine the parabolic waveforms (i.e., coefficients b and b'), whereby currents $[LP]_{MIX}$ and $[UP]_{MIX}$ are obtained.

(4) The currents $[LP]_{MIX}$ and $[UP]_{MIX}$ are added to each other to obtain a desired nonsymmetrical parabolic wave.

It will be readily understood that the upward convex parabolic wave PARA2 forming a pair with the aforesaid downward convex parabolic wave PARA1 can be produced by exactly the same procedure as that mentioned above. In the foregoing procedure, the addition rate in the step (3) is so selected that the levels of UP and $\overline{UP}$ become dominant in the process of weighting between LP and $\overline{LP}$, and also between UP and $\overline{UP}$. However, in producing the upward convex parabolic wave PARA2, the above selection is so reversed that the levels of $\overline{LP}$ and $\overline{UP}$ become dominant to the contrary.

Now the circuit constitution of the present invention will be described below with reference to FIGS. 1, 4 and 5.

Figure 1:
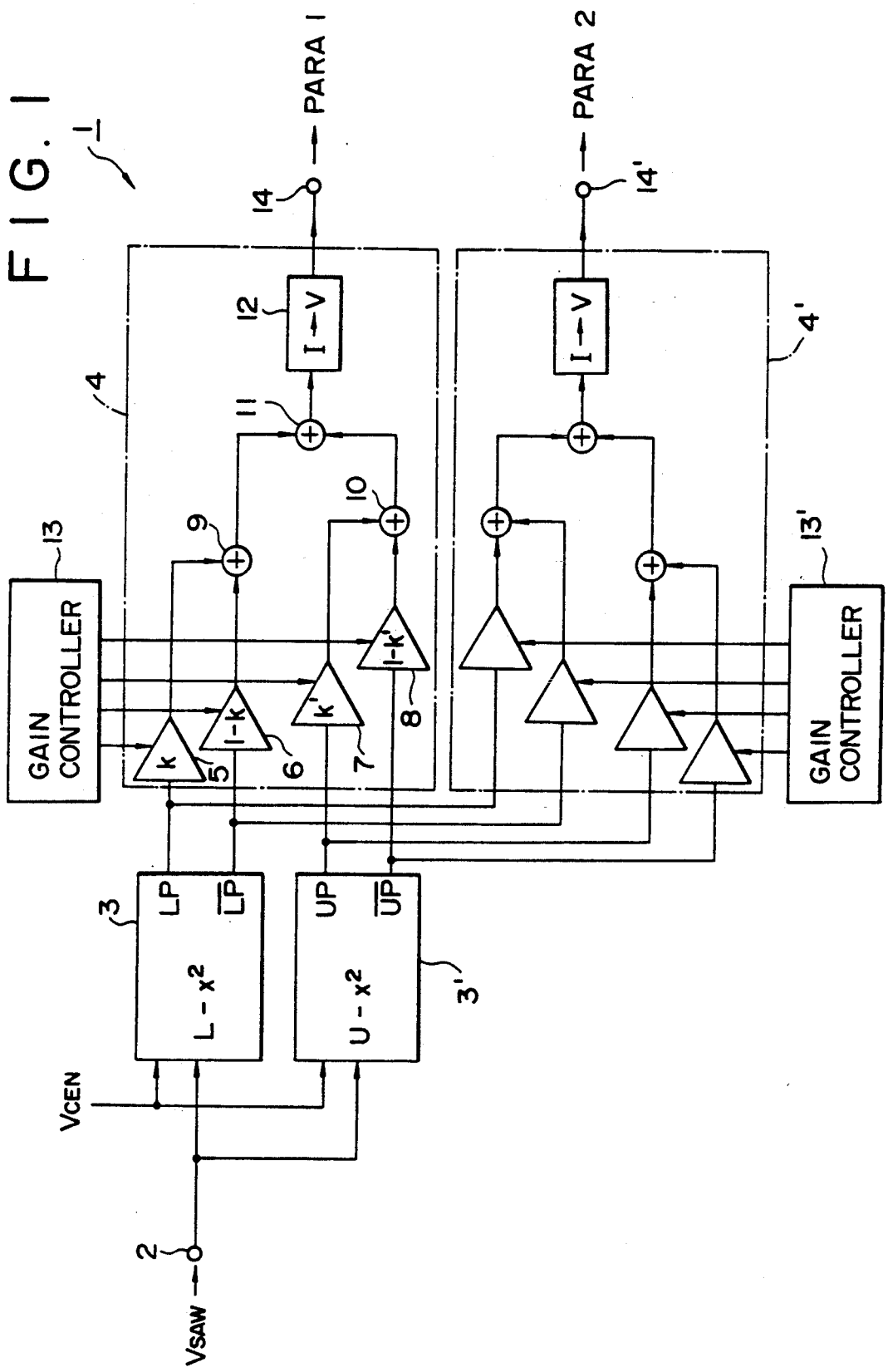
FIG. 1 is a circuit block diagram of an exemplary parabolic wave generator embodying the present invention.

FIG. 1 is a schematic circuit block diagram of the parabolic wave generator 1, wherein a sawtooth wave $V_{SAW}$ is fed from an unshown sawtooth generator to a signal input terminal 2.

Denoted by 3, 3' ared current calculating circuits each provided to calculate the squared current by converting the difference between the sawtooth voltage $V_{SAW}$ and the center voltage $V_{CEN}$ into a current and squaring the same. One circuit 3 (abbreviated as $L-x^2$ in the diagram) serves for producing LP and $\overline{LP}$, while the other circuit 3' (abbreviated as $U-x^2$ in the diagram) for producing UP and $\overline{UP}$.

Reference numerals 4, 4' denote waveform processors provided immediately posterior to the squared current calculating circuits 3, 3' respectively. Since both waveform processors 4, 4' are the same in circuit constitution, merely one processor 4 alone will be described below.

In an equivalent circuit diagram of the waveform processor 4, it comprises amplifiers 5, 6, 7, 8 of which gains are controllable, adders 9, 10, 11 and an I-V (current-to-voltage) converter 12, wherein the gains of the amplifiers 5, 6, 7, 8 are controlled by a signal outputted from a gain controller 13.

More specifically, the output signal LP from the squared current calculating circuit 3 is supplied to the amplifier 5 of the gain k, while the other output signal $\overline{LP}$ is supplied to the amplifier 6 of the gain $(1-k)$, and the outputs of the two amplifiers 5, 6 are added to each other in the adder 9 to thereby produce an output $[LP]_{MIX}$.

Similarly, the output signal UP from the other squared current calculating circuit 3' is supplied via the amplifier 7 of the gain k' to the adder 10, while the other output signal $\overline{UP}$ is supplied via the amplifier 8 of the gain $(1-k')$, so that an output $[UP]_{MIX}$ is produced as a result of adding the two signals.

The output $[LP]_{MIX}$ of the adder 9 and the output $[UP]_{MIX}$ of the adder 10 are supplied to another adder 11 so as to be added to each other, and the resultant current is then converted into a voltage by the I-V converter 12 so that a parabolic wave PARA1 is obtained as a final signal from the output terminal 14.

Similarly to the above, the waveform processor 4' also comprises a plurality of adders and amplifiers controlled by means of an amplifier gain controller 13' and produces a final parabolic wave PARA2 from a signal output terminal 14'.

Figure 4:
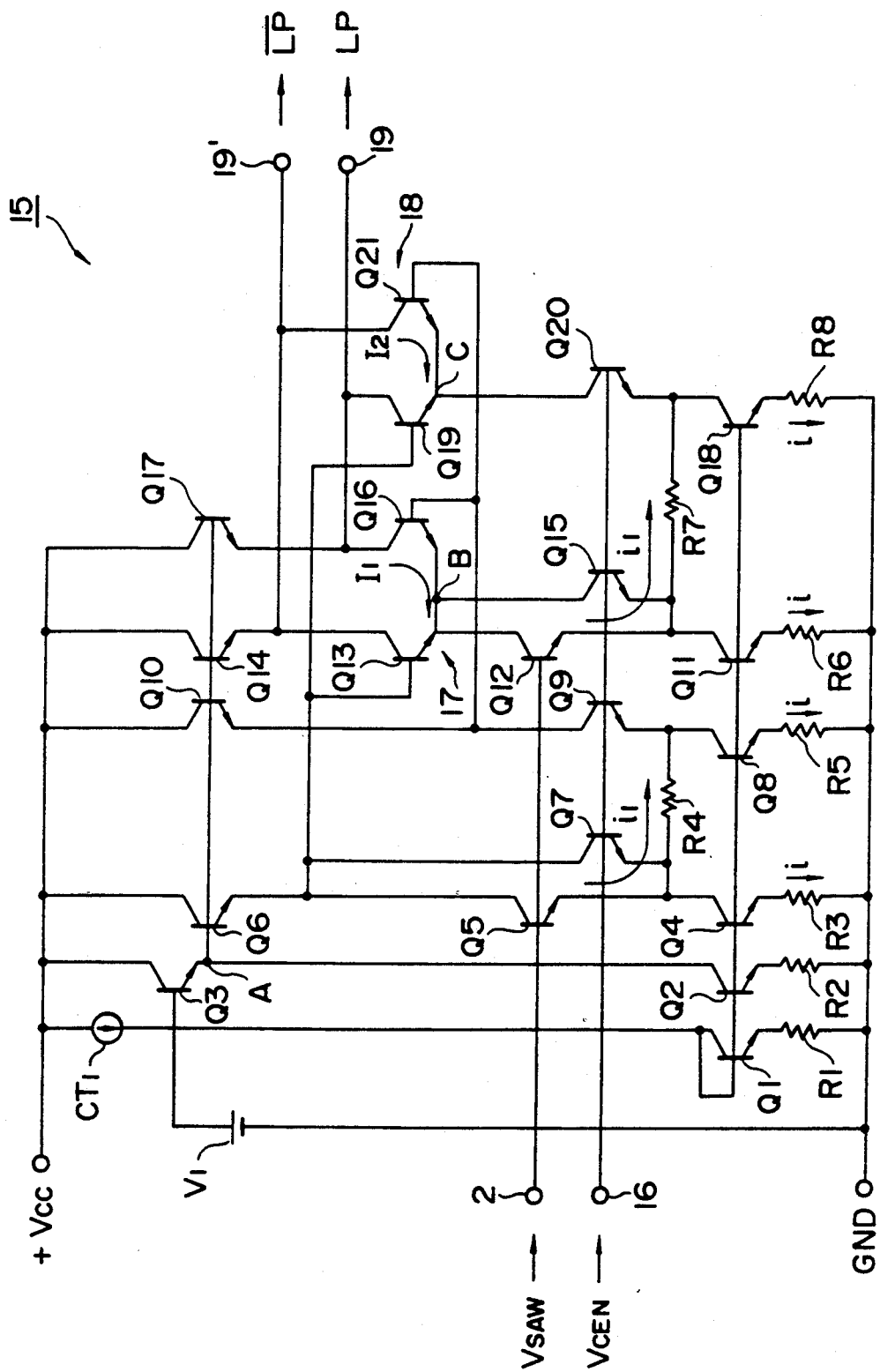
FIG. 4 is a circuit diagram of an exemplary squared current calculating circuit in the embodiment of FIG. 1.

FIG. 4 shows an exemplary constitution 15 of the squared current calculating circuit 3.

A sawtooth voltage $V_{SAW}$ is applied via a signal input terminal 2 to common bases of NPN transistors Q5 and Q12.

Meanwhile a center voltage $V_{CEN}$ is applied via a signal input terminal 16 to common bases of NPN transistors Q7, Q9, Q15 and Q20.

A constant current source CT1 and NPN transistors Q1, Q2, Q4, Q8, Q11 and Q18 constitute a constant current generator, wherein the bases of such transistors are connected in common to the collector of the transistor Q1 which is further connected via the constant current source CT1 to a power supply terminal +Vcc. And the emitters of such transistors are grounded respectively via resistors R1, R2, R3, R5, R6 and R8 of mutually equal resistance values.

The transistors Q2, Q4, Q8, Q11 and Q18 function as a constant current source (whose current value is defined as i), wherein the collector of the transistor Q4 is connected to the common emitters of the transistors Q5 and Q7, and the collector of the transistor Q8 is connected to the emitter of the transistor Q9. Meanwhile the collector of the transistor Q11 is connected to the common emitters of the transistors Q12 and Q15, and the collector of the transistor Q18 is connected to the emitter of the transistor Q20.

A resistor R4 is inserted between the emitters of the transistors Q7 and Q9, and a resistor R7 is inserted between the emitters of the transistors Q15 and Q20.

The bases of NPN transistors Q6, Q10, Q14 and Q17 are rendered common and connected to the emitter of an emitter-collower NPN transistor Q3. Denoted by V1 is a voltage applied to the base of the transistor Q3.

The emitter of the transistor Q6 is connected to the collectors of the transistors Q5 and Q7, and the emitter of the transistor Q10 is connected to the collector of the transistor Q9.

Denoted by 17 and 18 are differential pairs, of which one pair 17 consists of NPN transistors Q13 and Q16, while another pair 18 consists of NPN transistors Q19 and Q21.

More specifically, the common emitters of the transistors Q13 and Q16 are connected to the collectors of the transistors Q12 and Q15, and the common emitters of the transistors Q19 and Q21 are connected to the collector of the transistor Q20.

The bases of the transistors Q13 and Q19 are connected to the emitter of the transistor Q6, and the bases of the transistors Q16 and Q21 are connected to the emitter of the transistor Q10.

The collectors of the transistors Q16 and Q19 are both connected to the emitter of the transistor Q17 and the signal output terminal 19, so that a signal LP is obtained from the output terminal 19.

Meanwhile, the collectors of the transistors Q13 and Q21 are both connected to the emitter of the transistor Q14 and the signal output terminal 19', so that a signal $\overline{LP}$ is obtained from the output terminal 19'.

In the circuit constitution 15 described above, the following equation is valid with regard to the difference current $i_1$ (obtained by conversion of the difference voltage $V_{SAW}-V_{CEN}(>0)$) between the transistors Q5 and Q7 or between Q12 and Q15, and also to the difference currents $I_1$ and $I_2$ obtained respectively from the differential pairs 17 and 18.

In respect of the potential difference between the emitter (point A) of the transistor Q3 and the common emitter (point B) of the differential pair 17, there exists the relationship shown below:

$$V_{BE}(Q6) + V_{BE}(Q13) = V_{BE}(Q10) + V_{BE}(Q16) \quad (1)$$

In Eq. (1), $V_{BE}(Qi)$ signifies the base-emitter voltage of the transistor Qi and is expressed as $$V_{BE}(Qi) = \frac{k_B \cdot T}{q} \cdot \ln \frac{I_e}{I_o} \quad (2)$$

(where $I_e \gg I_o$ in Ebers-Moll's formula; in which $k_B$ stands for Boltzmann's constant, T for absolute temperature, q for elementary electric quantum, $I_e$ for emitter current, and $I_o$ for saturation current.)

Using Eq. (2), therefore, Eq. (1) may be rewritten as $$\left( \frac{k_B \cdot T}{q} \cdot \ln \frac{i+i_1}{I_o} \right) + \left( \frac{k_B \cdot T}{q} \cdot \ln \frac{(i+i_1)/2 - I_1}{I_o} \right) = \quad (3)$$
$$\left( \frac{k_B \cdot T}{q} \cdot \ln \frac{i-i_1}{I_o} \right) + \left( \frac{k_B \cdot T}{q} \cdot \ln \frac{(i+i_1)/2 + I_1}{I_o} \right)$$

Solving Eq. (2) with regard to $I_1$, the result is obtained as $$I_1 = \frac{i_1^2 + i_1 \cdot i}{2 \cdot i} \quad (4)$$

Similarly in another differential pair 18, there exists the following relationship in respect of the difference between the potential at the point A and the potential at the common emitter (point C) of the transistors Q19 and Q21.

$$V_{BE}(Q6) + V_{BE}(Q19) = V_{BE}(Q10) + V_{BE}(Q21) \quad (5)$$

From above, $$\left(\frac{k_B \cdot T}{q} \cdot \ln \frac{i + i_1}{I_o}\right) + \left(\frac{k_B \cdot T}{q} \cdot \ln \frac{(i + i_1)/2 - I_2}{I_o}\right) = \quad (6)$$

$$\left(\frac{k_B \cdot T}{q} \cdot \ln \frac{i - i_1}{I_o}\right) + \left(\frac{k_B \cdot T}{q} \cdot \ln \frac{(i + i_1)/2 + I_2}{I_o}\right)$$

Solving Eq. (6) with regard to $I_2$, the result is obtained as:

$$I_2 = \frac{i_1 \cdot i - i_1^2}{2 \cdot i} \quad (7)$$

From Eqs. (4) and (7), $$I_1 - I_2 = \frac{i_1^2}{i} \quad (8)$$

Thus, the squared currents derived from the input sawtooth wave can be taken out from the signal output terminals 19 and 19'. It is apparent that, due to the existence of the differential pairs Q5, Q7 and Q12, Q15, the current $i_1$ flows in the circuit 15 merely when the $V_{SAW}$ level exceeds the $V_{CEN}$ level.

As for the squared current calculating circuit 3', the aforementioned circuit constitution 15 may be so modified partially that the current $i_1$ flows merely when the $V_{SAW}$ level is under the $V_{CEN}$ level.

Figure 5:
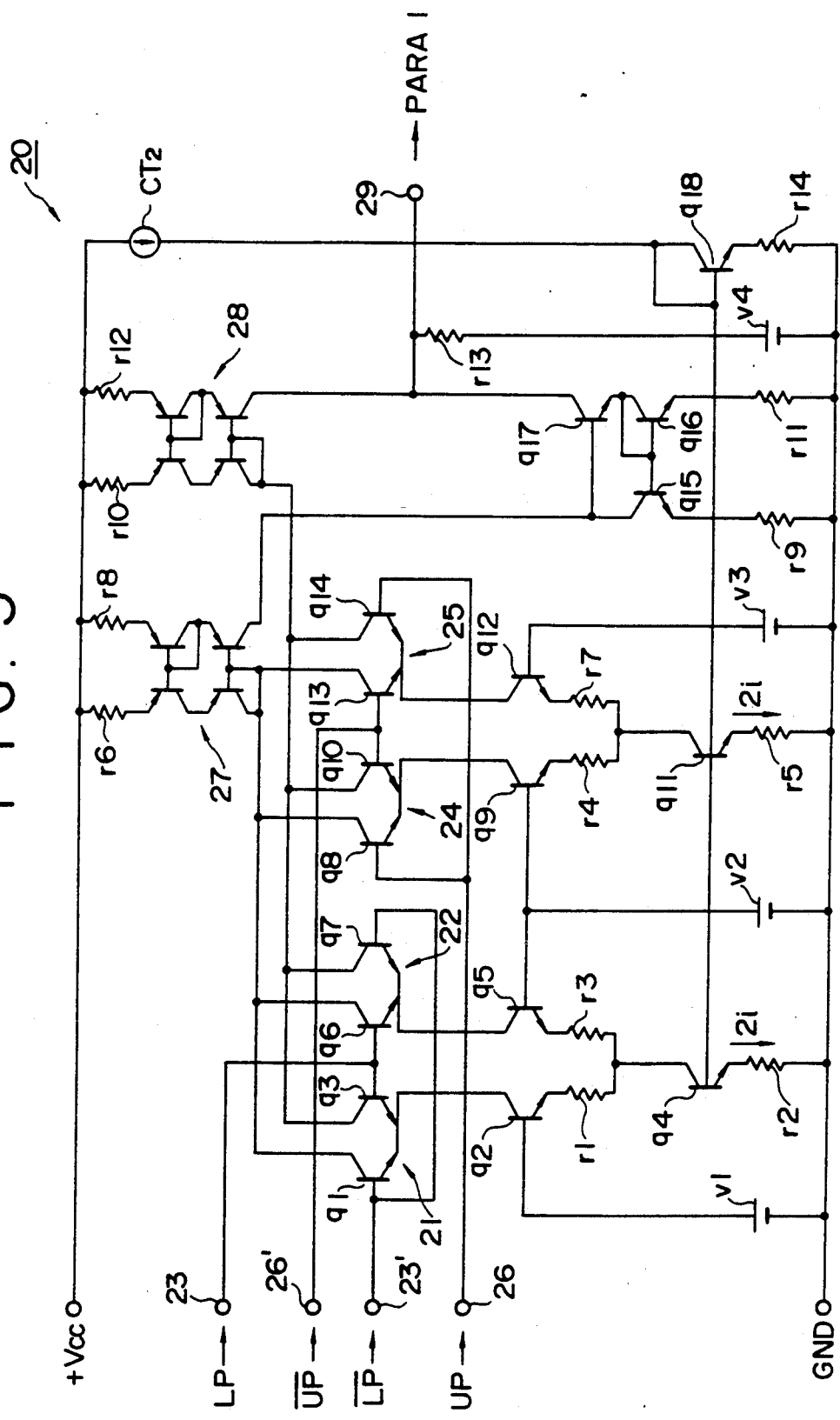
FIG. 5 is a circuit diagram of an exemplary waveform processor in the embodiment of FIG. 1.

FIG. 5 shows an exemplary circuit constitution 20 of the waveform processor 4 (4'), wherein amplifiers 5, 6 and 7, 8 are formed into a double differential amplifying circuit.

A differential pair 21 consists of NPN transistors q1 and q3, while another differential pair 22 consists of NPN transistors q6 and q7, wherein the bases of the transistors q3 and q6 are connected in common to a signal input terminal 23. And the signal LP from the aforementioned squared current calculating circuit 3 is supplied to the input terminal 23.

The bases of the transistors q1 and q7 are connected in common to a signal input terminal 23', to which the signal $\overline{LP}$ from the squared current calculating circuit 3 is supplied.

The common emitters of the differential pairs 21, 22 are connected to the collectors of the NPN transistors q2 and q5 respectively, and resistors r1, r3 provided on the emitter side of the transistors q2, q5 are connected to the collector of the NPN transistor q4 which serves as a constant current source.

A voltage v1 is applied to the base of the transistor q2, and a voltage v2 is applied to the base of the transistor q5.

Denoted by 24, 25 are differential pairs, of which one differential pair 24 consists of NPN transistors q8 and q10, while the other differential pair 25 consists of NPN transistors q13 and q14.

The bases of the transistors q8 and q14 are both connected to a signal input terminal 26, and the signal UP from the squared current calculating circuit 3' is fed to such two bases.

The bases of the transistors q10 and q13 are both connected to a signal input terminal 26', and the signal $\overline{UP}$ from the squared current calculating circuit 3' is fed to such two bases.

The common emitters of the differential pairs 24 and 25 are connected respectively to the collectors of NPN transistors q9 and q12, whose emitters are connected via resistors r4 and r7 respectively to the collector of a transistor q11 which serves as a constant current source.

A voltage v2 is applied to the base of the transistor q9, and a voltage v3 is applied to the base of the transistor q12.

The constant current generator includes a current mirror circuit configuration and comprises a constant current source CT2 and current turnback NPN transistors q18, q4 and q11. More specifically, the bases of the transistors q4 and q11 are connected in common to the base of the transistor q18 while being connected also to the collector of the transistor q18, whose collector is connected via the constant current source CT2 to a power supply terminal +Vcc.

Denoted by r2 is an emitter resistor for the transistor q4, and r5 denotes an emitter resistor for the transistor q11. Since the resistance values thereof are equal to each other, the emitter currents in the transistors q4 and q11 are mutually equal (defined here as 2·i). Denoted by r14 is an emitter resistor for the transistor q18.

The collectors of the transistors q1, q6, q8 and q13 are used in common and are so arranged that the current is turned back by a current mirror 27. Meanwhile the collectors of the transistors q3, q7, q10 and q14 are used in common and are so arranged that the current is turned back by a current mirror 28. Such currents are subtracted in a circuit consisting of transistors q15, q16 and q17.

The bases of the transistors q15 and q16 are connected in common to the collector of the transistor q16, and the collector of the transistor q15 is connected to the collector of the PNP transistor in the output stage of the current mirror 27. Meanwhile the collector of the transistor q16 is connected via the transistor q17 to the collector of the PNP transistor in the output stage of the current mirror 28. And the base of the transistor q17 is connected to the collector of the transistor q15.

Denoted by r9 is an emitter resistor for the transistor q15, and r11 denotes an emitter resistor for the transistor q16. The resistance values thereof are set to be equal to each other.

A signal output terminal 29 is connected to the collector of the transistor q17, and a constant voltage source consisting of a resistor r13 to supply a voltage v4 is provided between the signal output terminal 29 and the ground line.

And a parabolic wave PARA1 produced by voltage-to-current conversion is obtained from the signal output terminal 29.

In the circuit constitution 20 mentioned above, the current addition rate between the signals LP and $\overline{\text{LP}}$ or between UP and $\overline{\text{UP}}$ is determined by the voltages v1, v2, v3 to consequently produce the currents $[\text{LP}]_{MIX}$ and $[\text{UP}]_{MIX}$.

More specifically, the maximum amplitude of the parabolic wave is determined by the voltage v2, and the amplitude change degree is determined by the voltages v1 and v3. The values of such voltages v1 and v3 can be set through a bus ($I^2C$ or the like).

Since the signal input terminals 23 and 23' are connected respectively to the signal output terminals 19 and 19' of the aforementioned circuit 15, the relationship expressed by Eqs. (1) and (5) is existent also between the transistors Q14, Q17 in the circuit 15 and the transistors q1, q3 and q6, q7 in the circuit 20, so that currents having the same value as determined by Eq. (8) and being mutually different in polarity come to flow in the transistors q1 and q3. Such currents are subtracted after being turned back by the current mirrors 27 and 28. (This process actually calculates the sum since it is a subtraction of mutually inverse currents.) As a result, the maximum output voltage $V_0$ obtained from the signal output terminal 29 is equal to the product of the resistance value r(13) of the resistor r13 and a double of $i_1^2/i$ (i.e., $V_0 = r(13) \times i_1^2 / i \times 2$).

Also with regard to the transistors q8, q10 and q13, q14, the relationship expressed by Eqs. (1) and (5) is existent between the transistors included in the squared current calculating circuit 3' correspondingly to Q14 and Q17, so that the condition is exactly the same as the above.

And the result of adding the currents $[\text{UP}]_{MIX}$ and $[\text{LP}]_{MIX}$ is converted into a voltage by means of the resistor r13 to consequently produce a desired parabolic voltage PARA1.

In the parabolic wave generator 1 mentioned above, the sawtooth voltage $V_{SAW}$ is compared with the center voltage $V_{CEN}$ and, in accordance with the individual cases of $V_{SAW} > V_{CEN}$ and $V_{SAW} < V_{CEN}$, squared currents of mutually reverse polarities are calculated and added to each other at an adequate rate to thereby produce $[\text{LP}]_{MIX}$ and $[\text{UP}]_{MIX}$. (This process corresponds to determination of the waveform of each parabolic current). And the two currents thus produced are added to each other to form a combined parabolic wave. Consequently there exists no possibility that any discontinuity or level difference is caused between the left and right regions of the parabolic waveform (where $t \geq 0$ and $t < 0$ with respect to the y-axis in the t-y coordinate system).

Figure 6:
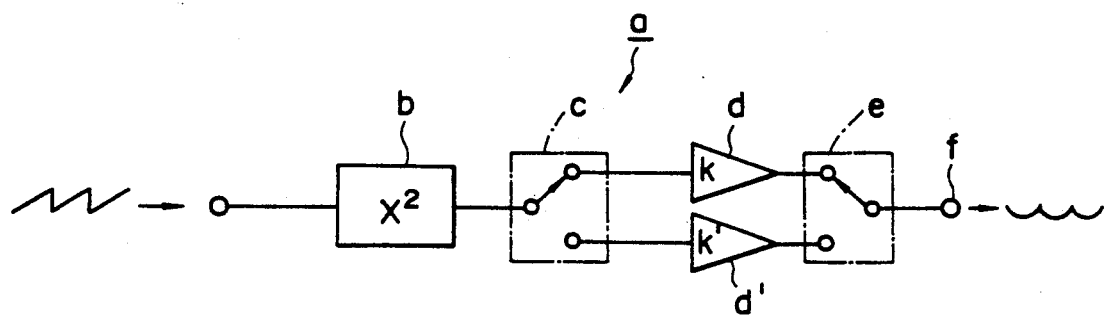
FIG. 6 is a schematic circuit block diagram of a conventional parabolic wave generator.

In the conventional example a of FIG. 6, the left and right parabolic wave portions are formed by amplifiers of mutually different gains with selective switching action, so that the offset in the squared current calculating circuit is suddenly revealed at the switching time. In contrast therewith, according to the embodiment of the present invention where the left and right parabolic wave portions are formed by addition of the currents, any offset in the squared current calculating circuit is averaged over one cycle of the parabolic wave to be eventually rendered inconspicuous.

Thus, as described hereinabove, the feature of the parabolic wave generator according to the present invention resides in comprising a first squared current calculating circuit for calculating, when the amplitude level of a sawtooth input signal is higher than the center level thereof, two squared currents of mutually reverse polarities each corresponding to the difference voltage between the two levels; a second squared current calculating circuit for calculating, when the amplitude level of the sawtooth input signal is lower than the center level thereof, two squared currents of mutually reverse polarities each corresponding to the difference voltage between the two levels; a first weighting-adding circuit for determining the waveform of the partial parabolic current by adding, at an adequate rate, the two squared currents of mutually reverse polarities obtained from the first squared current calculating circuit; a second weighting-adding circuit for determining the waveform of the other partial parabolic current by adding, at an adequate rate, the two squared currents of mutually reverse polarities obtained from the second squared current calculating circuit; and a current adding circuit for adding the output currents of the first and second weighting-adding circuits to thereby form a combined parabolic wave.

Therefore, when the amplitude level of the input sawtooth signal is higher than the center level thereof, one side portion of a nonsymmetrical parabolic wave is produced by adding, at a predetermined rate, the positive and negative currents each proportional to the square of the difference voltage between the two levels. And when the amplitude level of the input sawtooth signal is lower than the center level thereof, the other side portion is produced by adding, at another predetermined rate, the positive and negative currents each proportional to the square of the difference voltage between the two levels. Consequently, it becomes possible to generate the two side portions of mutually different parabolic waveforms. And a desired nonsymmetrical parabolic wave can be finally achieved by combining such two side portions with each other through addition of the currents thereof without raising any problem in regard of the discontinuity that may otherwise be caused by the switching action.

What is claimed is:

1. A parabolic wave generator comprising:

a first squared current calculating means for calculating, when the amplitude level of a sawtooth input signal is higher than the center level thereof, two squared currents of mutually reverse polarities each proportional to the square of the difference voltage between said two levels;

a second squared current calculating means for calculating, when the amplitude level of the sawtooth input signal is lower than the center level thereof, two squared currents of mutually reverse polarities each proportional to the square of the difference voltage between said two levels;

a first weighting-adding means for determining the waveform of the partial parabolic current by adding, at an adequate rate, the two squared currents of mutually reverse polarities obtained from said first squared current calculating means;

a second weighting-adding means for determining the waveform of the other partial parabolic current by adding, at an adequate rate, the two squared currents of mutually reverse polarities obtained from said second squared current calculating means; and a current adding means for forming a combined parabolic wave by adding the output currents of said first and second weighting-adding means.

2. A parabolic wave generator according to claim 1, wherein said first and second weighting-adding means are circuits for determining the partial parabolic waveforms by adding the positive and negative squared currents at different rates individually so that the combined parabolic wave obtained from said current adding means is rendered nonsymmetrical with respect to the peak thereof.

* * * * *